US009755580B2

(12) United States Patent
Desclos et al.

(10) Patent No.: US 9,755,580 B2
(45) Date of Patent: Sep. 5, 2017

(54) TUNABLE LOGARITHMIC AMPLIFIER

(71) Applicant: Ethertronics, Inc., San Diego, CA (US)

(72) Inventors: Laurent Desclos, San Diego, CA (US); Olivier Pajona, Nice (FR)

(73) Assignee: ETHERTRONICS, INC., San Diego, CA (US)

( * ) Notice: Subject to any disclaimer, the term of this patent is extended or adjusted under 35 U.S.C. 154(b) by 0 days.

(21) Appl. No.: 15/350,439

(22) Filed: Nov. 14, 2016

(65) Prior Publication Data
US 2017/0141738 A1    May 18, 2017

Related U.S. Application Data

(60) Provisional application No. 62/255,375, filed on Nov. 13, 2015.

(51) Int. Cl.
| | | |
|---|---|---|
| *H04B 1/06* | (2006.01) | |
| *H03F 1/16* | (2006.01) | |
| *H03F 1/26* | (2006.01) | |
| *H03F 3/24* | (2006.01) | |
| *H03F 3/191* | (2006.01) | |
| *H04B 1/48* | (2006.01) | |
| *H04W 4/00* | (2009.01) | |
| *H04W 84/12* | (2009.01) | |

(52) U.S. Cl.
CPC .............. *H03F 1/26* (2013.01); *H03F 3/191* (2013.01); *H03F 3/245* (2013.01); *H04B 1/48* (2013.01); *H03F 2200/294* (2013.01); *H03F 2200/451* (2013.01); *H04W 4/005* (2013.01); *H04W 84/12* (2013.01)

(58) Field of Classification Search
CPC .............. H03F 3/191; H03F 2200/129; H03F 2200/147; H03F 2200/243; H03F 2200/294; H04B 10/40; H04M 1/0202; H04M 1/6066
USPC ...................... 455/77, 232.1, 254; 330/75, 80
See application file for complete search history.

(56) References Cited

U.S. PATENT DOCUMENTS

| | | | | |
|---|---|---|---|---|
| 4,209,714 A | * | 6/1980 | Miyamoto | G06G 7/24 327/351 |
| 5,631,594 A | * | 5/1997 | Kimura | G06G 7/24 327/351 |
| 7,911,235 B2 | * | 3/2011 | Brown | H03D 1/18 327/51 |
| 9,236,892 B2 | * | 1/2016 | Dupuy | H04B 1/0475 |

(Continued)

*Primary Examiner* — Quochien B Vuong
(74) *Attorney, Agent, or Firm* — Coastal Patent Law Group, P.C.

(57) ABSTRACT

The disclosure concerns a tunable logarithmic detector amplifier (TLDA) system where dynamic tuning functionality is applied to resonant circuits used for feedback control as well as applying tuning to the amplifier. Control signals for the tuning function are generated from the baseband processor. The control of the amplifier tuning and resonator tuning can be performed from information derived from baseband where metrics such as SNR, SINR or CQI are used to optimize system performance. Bandwidth and sensitivity of the receiver are key specifications targeted for optimization using this technique. This technique can be implemented in designs where a wide bandwidth is required.

18 Claims, 7 Drawing Sheets

(56) References Cited

U.S. PATENT DOCUMENTS 9,397,382 B2 * 7/2016 Brown .................... H03D 1/08
2015/0070058 A1 3/2015 Rada et al.

* cited by examiner

TUNABLE LOGARITHMIC AMPLIFIER

CROSS-REFERENCE TO RELATED APPLICATIONS

This application claims benefit of priority with U.S. Provisional Ser. No. 62/255,375, filed Nov. 13, 2015; the contents of which are hereby incorporated by reference.

BACKGROUND

Field of the Invention

This invention relates to communication systems; and more particularly, to a tunable logarithmic amplifier, systems incorporating the same, and an improved method of signal reception in radios using a tunable logarithmic amplifier.

Description of the Related Art

Radio based communication systems contain transmit and receive sub-systems, with the receive sub-system tasked with receiving small amplitude signals which are quite often close to the noise level that is present in the receiver. These radio based communication systems are becoming more common in society as the use of cell phones and Wi-Fi systems along with radio based Machine to Machine (M2M) become more prevalent. Advances in noise figure reduction in Low Noise Amplifiers (LNAs) along with signal processing techniques have improved the sensitivity of radios. A need for continued improvements in receiver sensitivity will require advances in other technologies or architectures in the receiver sub-system.

One of the main limiters of receiver sensitivity is the quality of the LNA, since this provides the first stage of amplification for the weak signals being received. A class of amplifier that is used in receivers is a logarithmic amplifier (termed a "log amp"), with the log amp having the characteristic of providing an output signal that is proportional to the logarithm of the input signal. The logarithmic relationship between input and output signals of the amplifier provide for the ability to amplify small input signals without amplifying the noise present at the amplifier input port. A common method of achieving a log amp topology is to connect multiple gain blocks in series. Such a topology provides the logarithmic function at the expense of dynamic range and bandwidth.

A more recent configuration, as described by Rada et al. in US 2015/0070058, published Mar. 12, 2015 ("the '058 pub"), has been developed is termed a logarithmic detector amplifier (LDA) system and consists of an amplifier circuit configured to receive an input signal and generate an oscillation based on the input signal, a sampling circuit coupled to the amplifying circuit and configured to terminate the oscillation based on a predetermined threshold to periodically clamp and restart the oscillation to generate a series of pulses modulated by the oscillation and the input signal, and one or more resonant circuits coupled with the amplifying circuit and configured to establish a frequency of operation and output an RF signal; the contents of the '058 pub. are hereby incorporated by reference. This circuit configuration, as described in the '058 pub., can result in improved frequency selectivity which results in higher sensitivity compared to a standard log amp. This circuit topology, however, also suffers from reduced bandwidth and dynamic range.

There is a long felt need for a receive system that provides the benefits of a logarithmic amplifier along with improved bandwidth and dynamic range to accommodate radio systems that need to cover multiple and wider frequency ranges. Along with these improvements there is also a need to provide dynamic optimization of receive performance of a radio system for mobile devices and devices where the environment or propagation channel changes during the course of operation, for example, the changes to the performance of the radio incurred when a smartphone is placed in the users' hand and then placed next to the head.

SUMMARY OF THE INVENTION

This disclosure describes a tunable logarithmic detector amplifier (TLDA) system where dynamic tuning functionality is applied to resonant circuits used for feedback control as well as applying tuning to the amplifier. Control signals for the tuning function are generated from the baseband processor. The control of the amplifier tuning and resonator tuning can be performed from information derived from baseband where metrics such as SINR or CQI are used to optimize system performance. Bandwidth and sensitivity of the receiver are key specifications targeted for optimization using this technique. This technique can be implemented in designs where a wide bandwidth is required.

DETAILED DESCRIPTION OF THE PREFERRED EMBODIMENTS

In the following description, for purposes of explanation and not limitation, details and descriptions are set forth in order to provide a thorough understanding of how to make and use various illustrated embodiments of the invention. However, while certain specifics are described and illustrated, it will be apparent to those skilled in the art that the invention may be practiced in other embodiments that depart from these details and descriptions, but which may utilize or incorporate known parameters, by substantially the same means, in order to accomplish similar results. Accordingly, the descriptions provided herein are intended to enable those with skill in the art to practice the invention, but such descriptions are not intended to limit the spirit and scope of the same.

Figure 1:
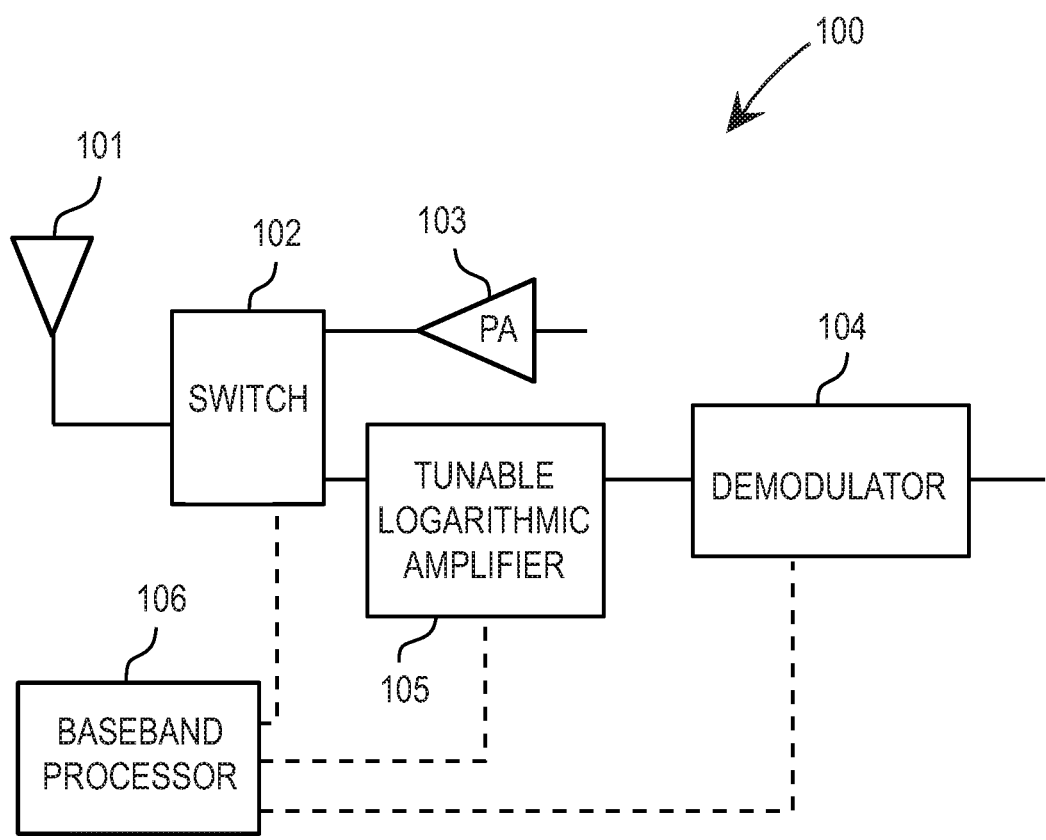
FIG. 1 shows a communication system including a power amplifier (PA), switch, antenna, tunable log amplifier, demodulator, and baseband processor.

Now turning to the drawings, FIG. 1 shows a communication system 100 including plurality of system elements such as: a power amplifier (PA) 103, switch 102, antenna 101, tunable log amplifier 105, demodulator 104, and baseband processor 106. The antenna is coupled to the switch. The switch is coupled to each of the PA and the tunable logarithmic amplifier. The tunable logarithmic amplifier is further coupled to the demodulator. The baseband processor is coupled to each of: the switch, the tunable logarithmic amplifier and the demodulator such that control signals can be communicated therebetween for varying a state of each of these elements of the communication circuit.

Figure 2:
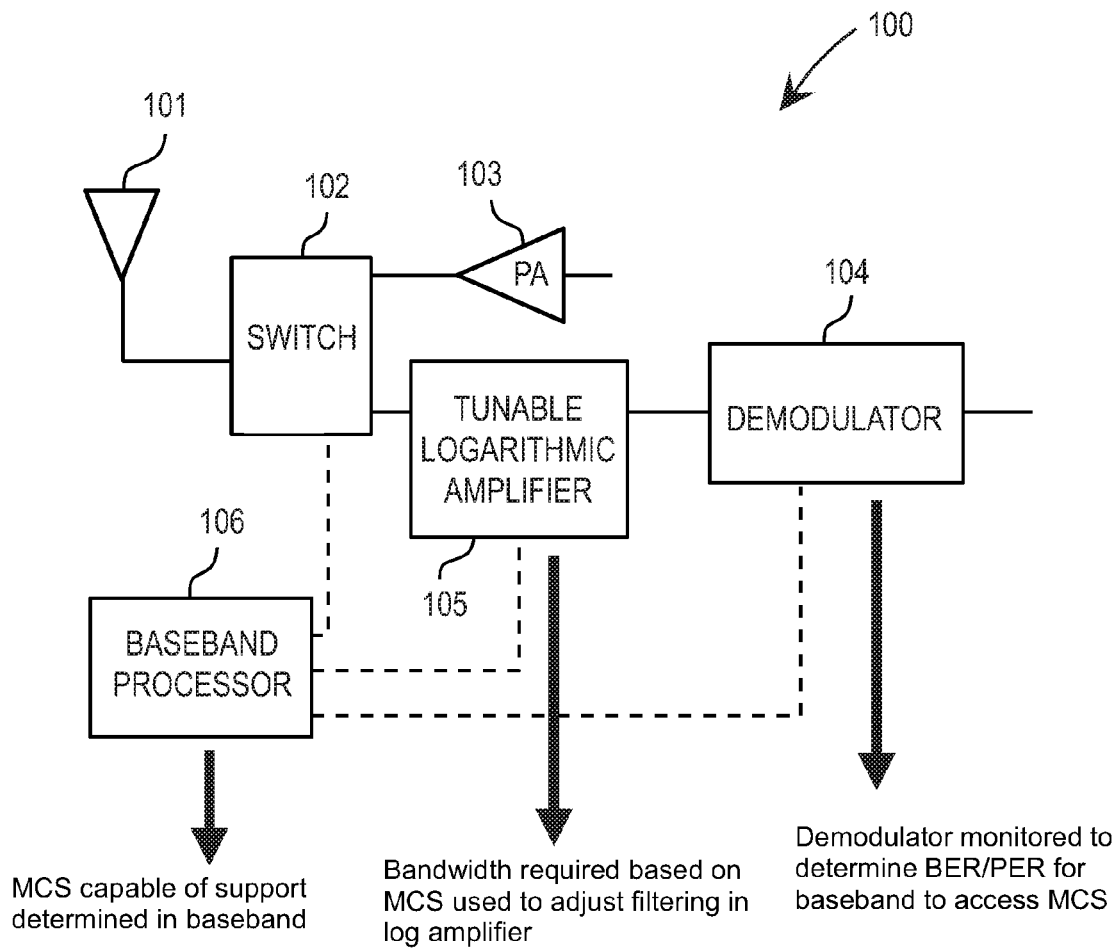
FIG. 2 shows a communication system similar to that of FIG. 1, wherein a tunable logarithmic amplifier is integrated into and receives control information from the baseband processor to provide a method of optimizing signal bandwidth based on system performance metrics.

In one embodiment herein, as shown in FIG. 2, a communication system 100 is similar to that of FIG. 1, wherein a tunable logarithmic amplifier 105 is integrated into and receives control information from the baseband processor 106 to provide a method of optimizing signal bandwidth based on system performance metrics. The baseband processor surveys signal metrics to determine the Modulation Coding Scheme (MCS) that can be supported and the bandwidth characteristics of the tunable logarithmic amplifier are adjusted to support the MCS level. Information from the demodulator is used by the baseband processor to assess signal quality. A lookup table 107 can store information within a memory module which can be accessed and utilized to determine signal parameters (inputs, etc.).

In one embodiment of a tunable logarithmic amplifier, an input RF signal is applied to input of the tunable log amp which is coupled to an input of an amplifying circuit, which in turn is connected to a first tunable resonator in a feedback loop configuration. The first tunable resonator is configured such that it can be dynamically tuned by the control bus and signal communicated therebetween, with this tuning providing the capability to adjust the frequency and bandwidth of the feedback signal applied to the input of the log amplifier at a first node. A first voltage input of the amplifying circuit is coupled to ground. A variable voltage signal is supplied to a second voltage input of the amplifying circuit via the control bus. A sampling circuit is connected to the input of the log amplifier at first node and is in turn connected to a frequency to voltage converter. Frequency to voltage converter is also coupled to the control bus via control signals, and exports the resulting RF signal to output.

Here, dynamic tuning functionality is applied to resonant circuits used for feedback control as well as applying tuning to the amplifying circuit (amplifier) as shown herein. Control signals for the tuning function are generated from a baseband processor and implemented through the control bus. The control of the amplifying circuit tuning, and resonator tuning, can be performed from information derived from baseband where metrics such as signal to interference plus noise ratio (SINR) or other channel quality indicator (CQI) are used to optimize system performance. Bandwidth and sensitivity of the receiver are key specifications targeted for optimization using this technique. This TLDA technique can be implemented in designs where a wide bandwidth is required.

Figure 3:
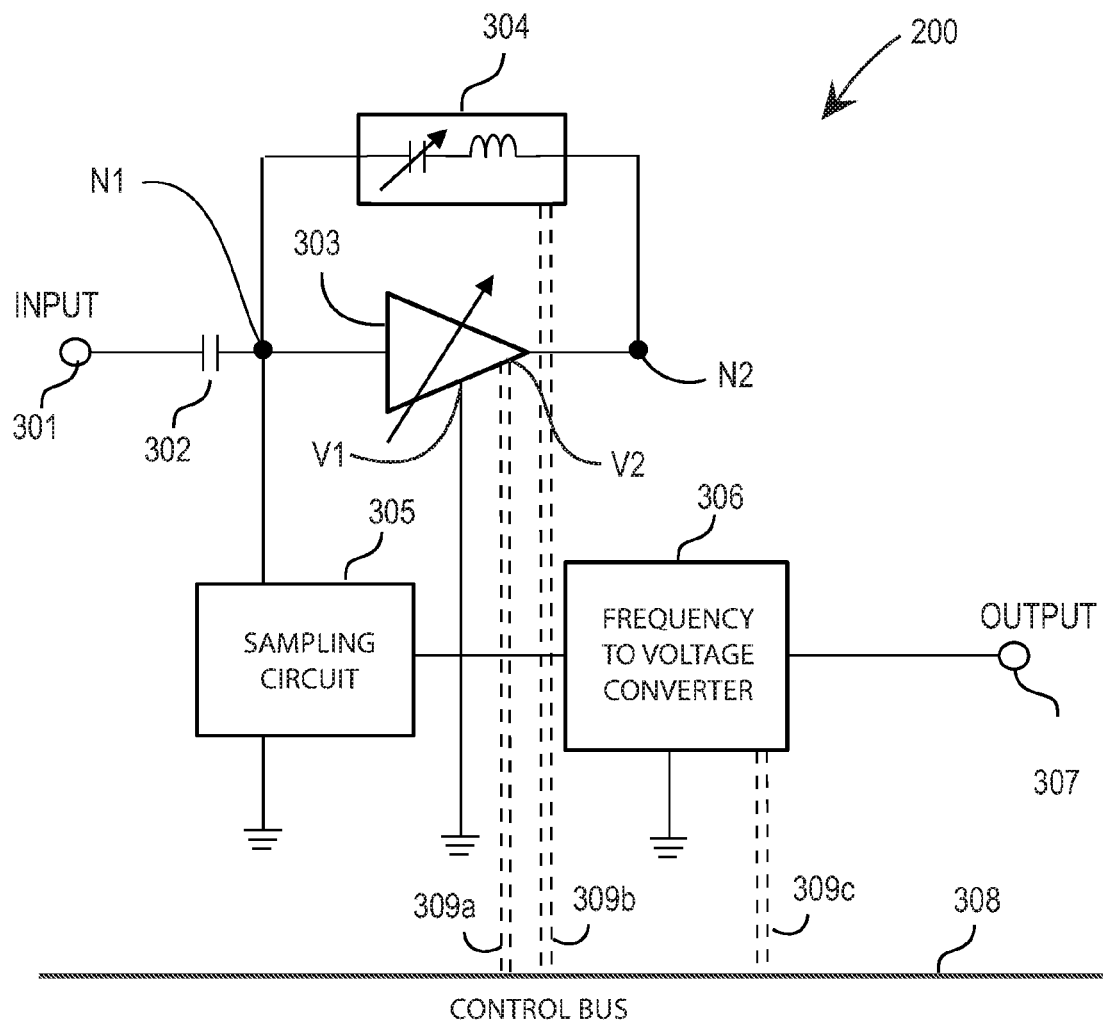
FIG. 3 shows a tunable logarithmic amplifier in accordance with embodiment.

In an embodiment of a tunable log amp 200, as illustrated in FIG. 3, an input RF signal is applied to an input port 301 of the tunable log amp which leads to an amplifying circuit 303. A first voltage input (V1) of the amplifying circuit is connected to ground, and a second voltage input (V2) of the amplifying circuit is coupled to the control bus wherein a dynamically varied voltage signal is provided. Note that a capacitor 302 is shown in the input side; however any passive reactance component may be implemented in a similar fashion for matching or otherwise as known by those with skill in the art. An output of the amplifying circuit 303 is applied to a first tunable resonator 304, with this first tunable resonator comprising a tunable circuit. An example of a tunable circuit is a series LC circuit wherein a capacitor of the LC circuit comprises a voltage controlled tunable capacitor. Other tunable resonator circuits, which can be similarly implemented, may include one or more tunable components configured to vary a reactance associated with the tunable resonator. The tunable resonator circuits herein are not limited to any of the illustrated configurations. An output of the first tunable resonator is applied to a first circuit node (N1), with this first circuit node located at the input of the amplifying circuit 303, resulting in a feedback arrangement for the amplifying circuit and first tunable resonator. A sampling circuit 305 is also coupled to the first circuit node (N1), with the sampling circuit in turn connected to a frequency to voltage converter 306. A control bus 308 is implemented where control signals 309(a-c) from the baseband processor, or other processor in the communication system, are generated and applied to each of the amplifying circuit 303 and the first tunable resonator 304 to provide dynamic control of the amplifying feedback circuit. The control bus is also connected to the frequency to voltage converter via control signal 309c to extract receive signal metrics such as signal to noise ratio (SNR), receive signal strength indicator (RSSI), and noise level. In a dynamic process, an algorithm in the baseband processor is used to adjust each of: the first tunable resonator 304 and the amplifying circuit 303, to optimize receive signal metrics at the frequency to voltage converter to satisfy system level requirements. Thus, the resulting circuit is an improvement over a conventional log amp, which is termed herein as a "tunable logarithmic detector amplifier (TLDA)" system, or otherwise as a "tunable log amp", due to the variable voltage signal delivered from the control bus to the amplifying circuit, and the tunable resonator(s), thereby providing dynamic control of the amplifying feedback circuit. The resulting RF signal is communicated through output port 307.

In another embodiment, a second resonator is connected between the first circuit node and the input of the sampling circuit. The second resonator may comprise a tunable capacitor and thus may be referred to as a second tunable resonator. This second tunable resonator can be used to dynamically adjust power level and/or frequency response to the sampling circuit. As described above, an example of a tunable circuit is a series LC circuit wherein the capacitor comprises a voltage tunable capacitor or other tunable reactance component. Alternatively, a parallel LC circuit can be implemented where the capacitor and/or inductor comprises a tunable component.

Figure 4:
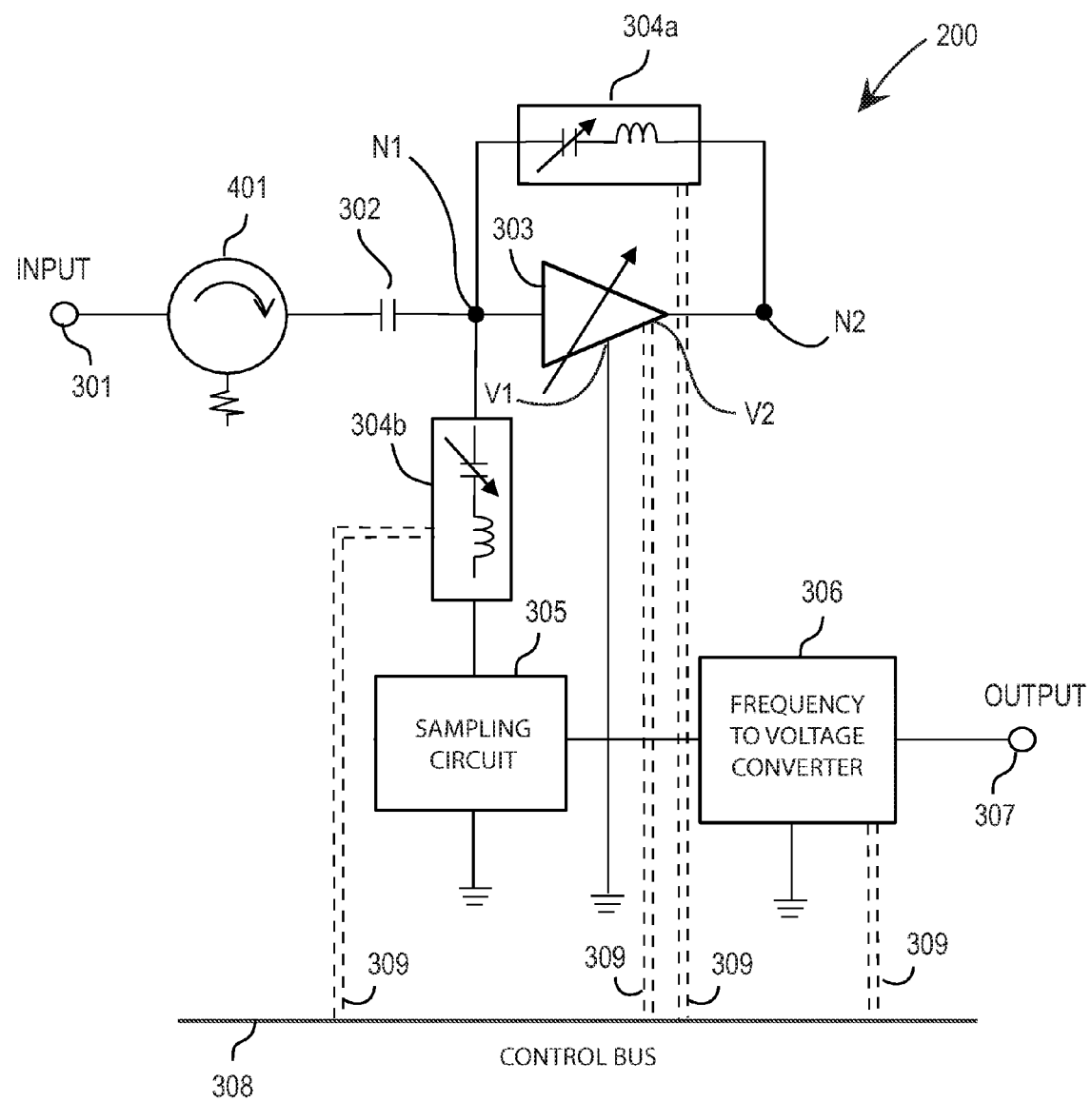
FIG. 4 shows a tunable logarithmic amplifier in accordance with another embodiment.

FIG. 4 illustrates an example similar to the tunable logarithmic amplifier as described in FIG. 3, wherein a second resonator 304b (in addition to the first resonator 304a of FIG. 3) is connected between the input of the log amplifier at the first node (N1) and the sampling circuit 305. A circulator 401 has been added to the input 301 of the log amplifier to provide isolation between the log amplifier feedback loop and the input port 301. Where the second resonator 304b is a tunable resonator, control lines 309 can extend between the control bus and the second tunable resonator for dynamically controlling one or more tunable components thereof.

Figure 5:
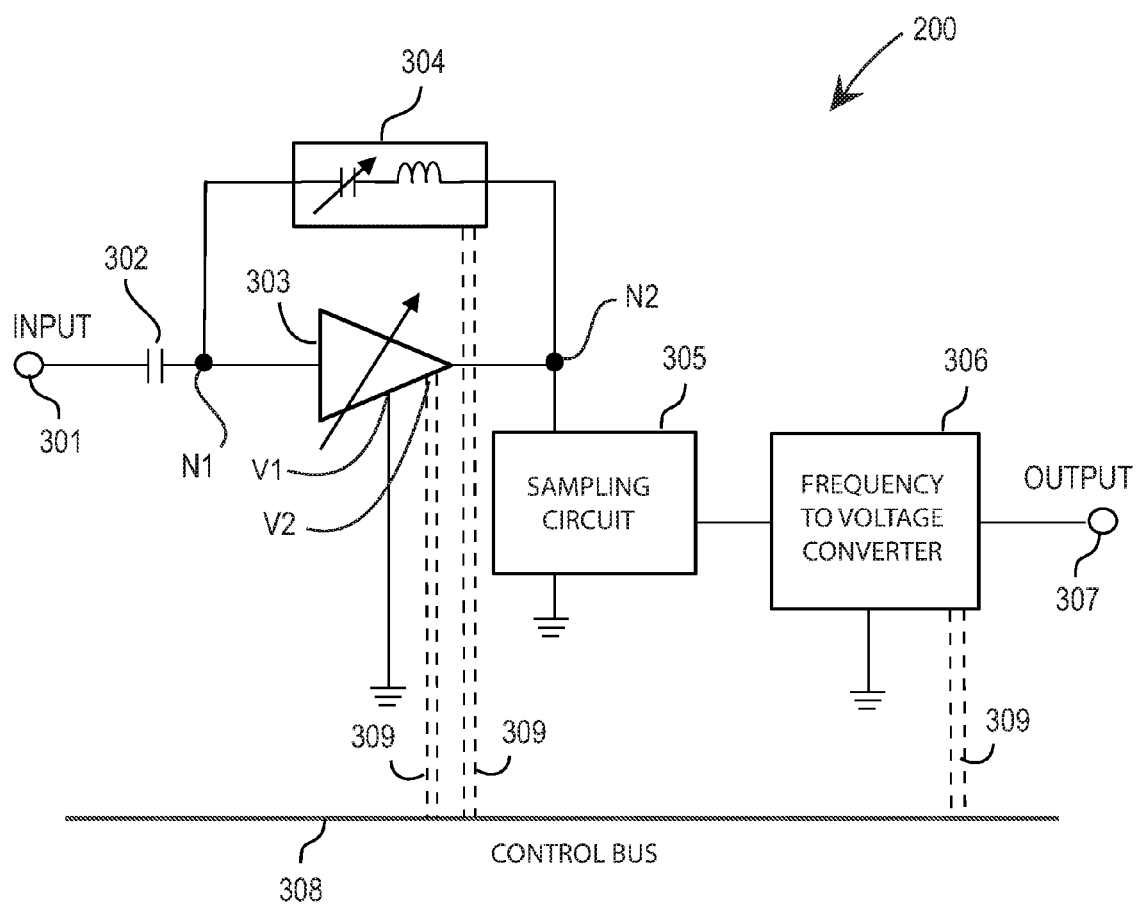
FIG. 5 shows a tunable logarithmic amplifier in accordance with yet another embodiment.

In yet another embodiment, as illustrated in FIG. 5 (which is also similar to the embodiment shown in FIG. 3 except as otherwise distinguished therefrom), an input signal is applied to an amplifying circuit 303. The output of the amplifying circuit is applied to a first resonator, with this first resonator comprising a tunable circuit and thus may be termed a "first tunable resonator". The output of the first tunable resonator 304 is applied to a first circuit node (N1), with this first circuit node located at the input of the amplifying circuit, resulting in a feedback arrangement for the amplifying circuit and first tunable resonator. A sampling circuit 305 is connected to a second circuit node (N2), with this second node located at the output of the amplifying circuit. The sampling circuit in turn is connected to a frequency to voltage converter 306. Locating the sampling circuit at the output of the amplifying circuit allows for higher amplitude levels of the received signals to be sampled, along with a wider frequency content of the signal. A control bus 308 is implemented where control signals 309 from the baseband processor or other processor in the communication system are generated and applied to the amplifying circuit 303 and first resonator 304 to provide dynamic control of the amplifying feedback circuit.

FIGS. 6(A-C) illustrate examples of tunable resonator topologies for use in the tunable logarithmic amplifier circuit.

Figure 6A:
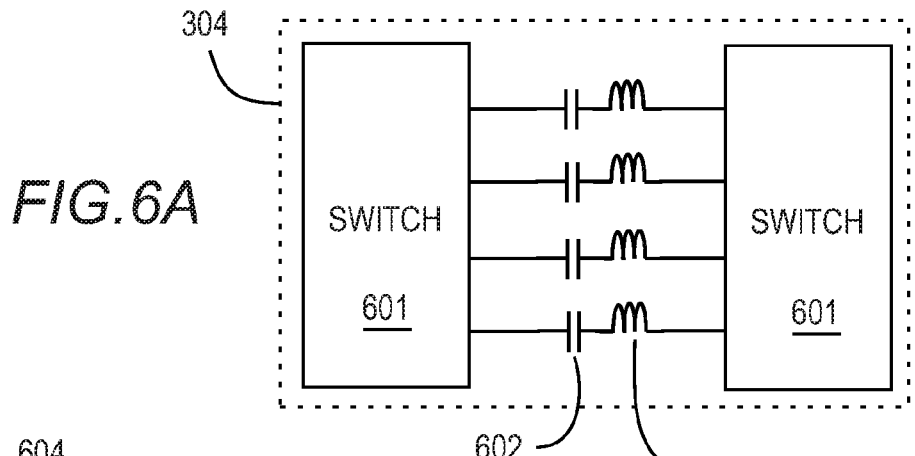
FIG. 6A shows a first topology of a tunable resonator for use in the tunable logarithmic amplifier circuits of FIGS. 3-5.

FIG. 6A shows a first topology of a resonator 304, wherein a pair of multi-port switches acre coupled with passive capacitor and inductor components extending therebetween, as shown.

Figure 6B:
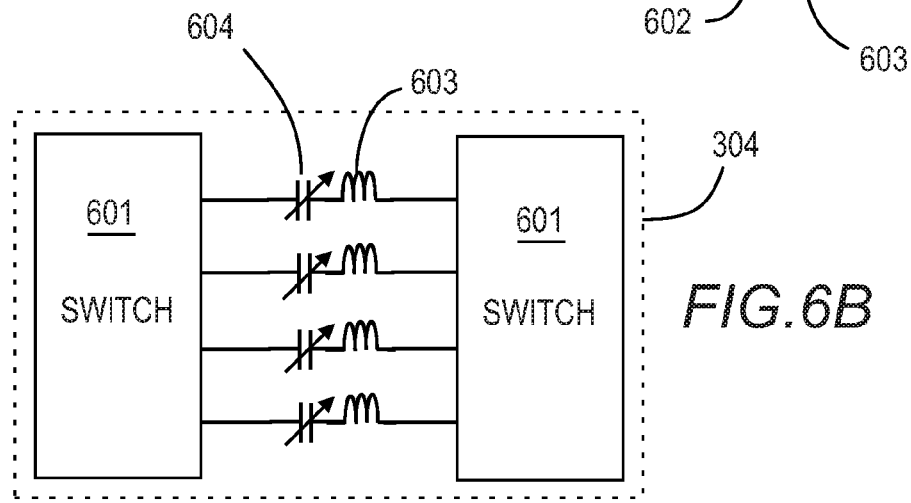
FIG. 6B shows a second topology of a tunable resonator for use in the tunable logarithmic amplifier circuits of FIGS. 3-5.

FIG. 6B shows a second topology of a resonator, here a tunable resonator 304, includes a first switch 601, four channels each including a tunable capacitor and an inductor in series extending from the first switch each to a respective port of a second switch, as shown.

Figure 6C:
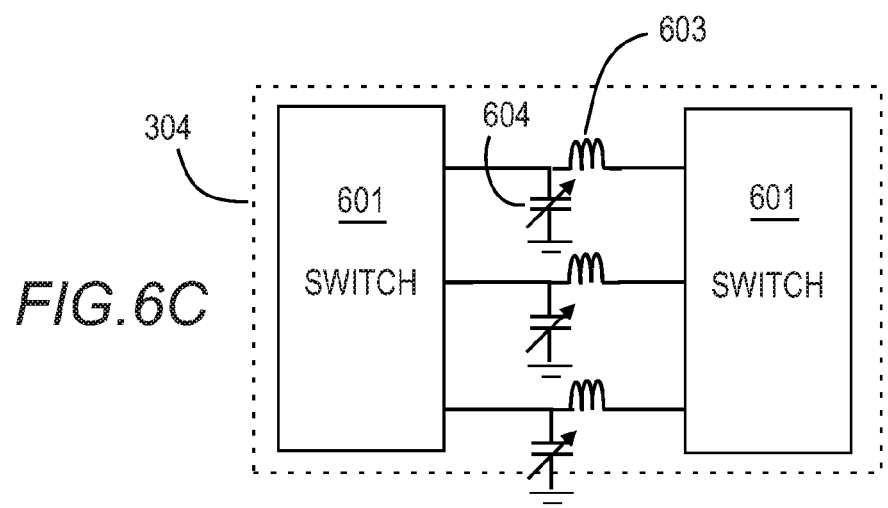
FIG. 6C shows a third topology of a tunable resonator for use in the tunable logarithmic amplifier circuits of FIGS. 3-5.

FIG. 6C shows yet another possible topology of a resonator 304, here a pair of switches are coupled by four channels between ports thereof, each channel including an inductor, and a tunable capacitor coupled in parallel with one port of the tunable capacitor coupled to ground.

While these embodiments illustrate possible resonator topologies, there are a myriad of possible combinations and arrangements of passive and active components, and thus these three embodiments are not exhaustive of the possible implementations as would be understood by those with skill in the art.

In another embodiment, the characteristics of a tunable log amp can be optimized using information derived from the demodulator circuit in a communication system. The demodulator receives signals from the tunable logarithmic amplifier and demodulates the waveform. Specifically, the algorithm in the baseband processor provides control signals to tune the tunable logarithmic amplifier based on metrics calculated from signals derived at the demodulator, with an example of these metrics being Bit Error Rate (BER), Packet Error Rate (PER), Carrier to Noise Ratio (CNR), or others as appreciated by those with skill in the art. The quality of the demodulated signal in the receive system can be improved dynamically by adjustments made to the tunable log amplifier.

Figure 7:
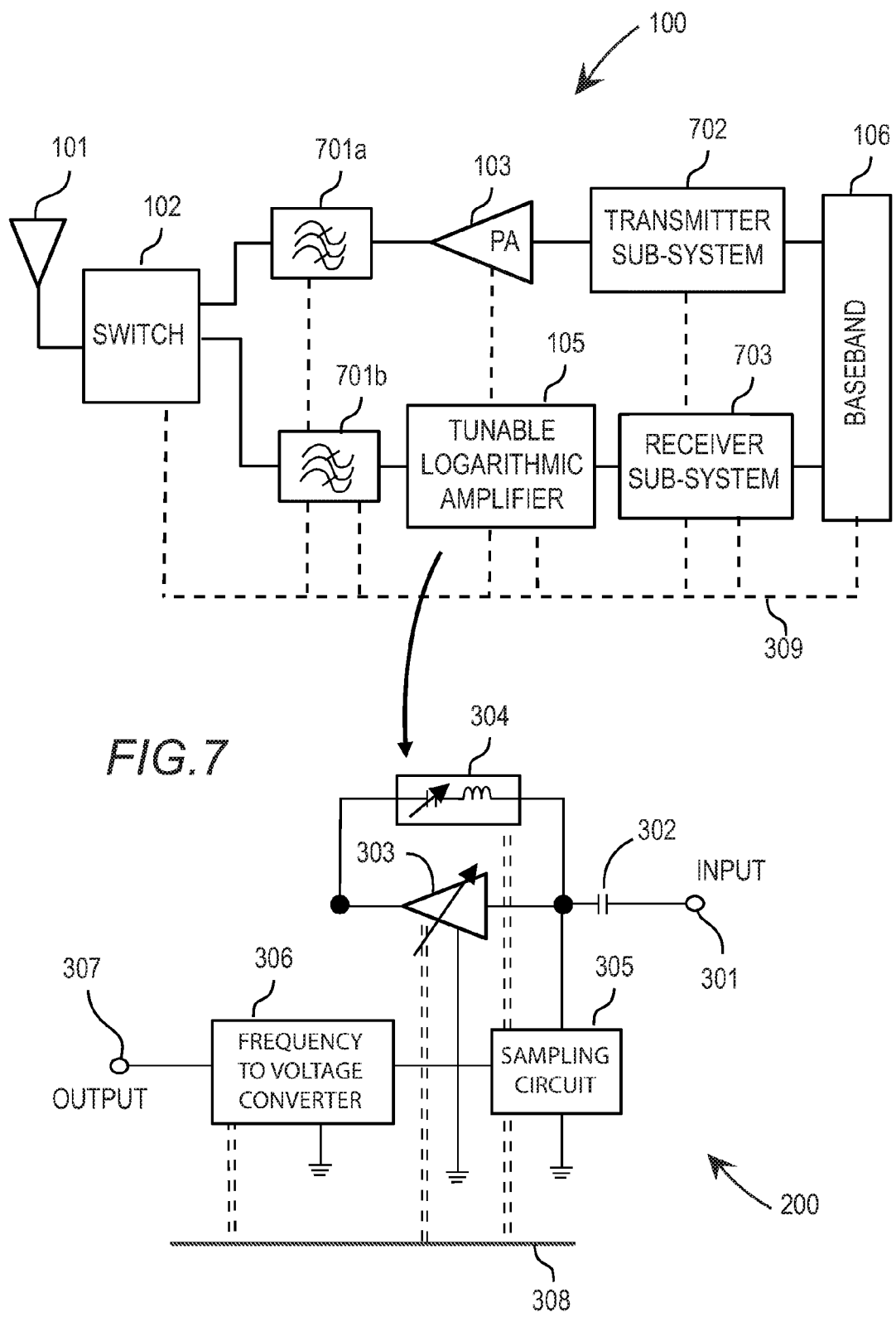
FIG. 7 shows a communication system wherein a tunable logarithmic amplifier is implemented.

In yet another embodiment, as shown in FIG. 7, a communication system 100 is described including an antenna 101, a switch 102, and each of a transmit section and a receive section. The transmit section includes a transmitter sub-system 702, power amplifier 103, and first filter 701a in series. The receive section includes a second filter 701b, a logarithmic amplifier 105, and a receiver sub-system 703. A baseband processor 106 is used to provide control of the communication system via a control bus 308 and control signals 309. The tunable log amp may comprise any embodiment as described in FIGS. 3-5, or any functional equivalent thereof as would be appreciated by those with skill in the art. Here, the tunable log amp comprises the embodiment illustrated in FIG. 3 (reference signs incorporated by reference).

The invention is defined by the claims appended hereto, with the forgoing description being merely illustrative of certain preferred embodiments of the invention, which are illustrated for the purpose of enabling those of skill in the art to make and use the invention. Those of ordinary skill in the art may envisage certain modifications to the forgoing embodiments which, although not explicitly discussed herein, do not depart from the scope of the invention, as defined by the appended claims.

What is claimed is:

1. A tunable logarithmic amplifier, comprising:
an amplifying circuit having a first voltage input coupled to ground and a second voltage input coupled to a control bus via a first control line extending therebetween, wherein the control bus is configured to vary the second input voltage communicated through the first control line for configuring a response of the amplifying circuit; and
a first tunable resonator circuit comprising:
at least one voltage-controlled tunable component, the voltage-controlled tunable component being coupled to the control bus via a second control line extending therebetween,
wherein an output of the amplifying circuit is coupled to the first tunable resonator circuit, and
wherein an output of the first tunable resonator circuit is further coupled to an input of the amplifying circuit at a first node disposed therebetween;
the tunable logarithmic amplifier further characterized by:
a sampling circuit coupled to the amplifying circuit; and
a frequency to voltage converter coupled to each of the sampling circuit and an output port of the tunable logarithmic amplifier;
wherein the frequency to voltage converter is further coupled to the control bus via control lines extending therebetween.

2. The tunable logarithmic amplifier of claim 1, wherein the sampling circuit is coupled to the amplifying circuit at the first node.

3. The tunable logarithmic amplifier of claim 2, further comprising a second resonator circuit connected between the sampling circuit and the first node.

4. The tunable logarithmic amplifier of claim 3, further comprising a circulator disposed between an input port of the tunable logarithmic amplifier and the first node.

5. The tunable logarithmic amplifier of claim 1, wherein the sampling circuit is coupled to the amplifying circuit at a second node, the second node disposed between the output of the amplifying circuit and the first tunable resonator circuit.

6. The tunable logarithmic amplifier of claim 1, further comprising a passive component coupled between an input port of the tunable logarithmic amplifier and the first node.

7. The tunable logarithmic amplifier of claim 6, wherein the passive component comprises a capacitor.

8. The tunable logarithmic amplifier of claim 1, wherein the first tunable resonator comprises two or more voltage-controlled tunable components.

9. The tunable logarithmic amplifier of claim 8, wherein the first tunable resonator comprises a plurality of paths, wherein at least one of the paths comprises a tunable capacitor and an inductor in series disposed between a pair of switches.

10. The tunable logarithmic amplifier of claim 8, wherein the first tunable resonator comprises a plurality of paths, wherein at least one of the paths comprises an inductor coupled to a tunable capacitor arranged in parallel with the respective path, the inductor and tunable capacitor being disposed between a pair of switches.

11. The tunable logarithmic amplifier of claim 8, wherein the first tunable resonator comprises a plurality of paths, wherein at least one of the paths comprises a passive capacitor and an inductor in series disposed between a pair of multi-port switches.

12. The tunable logarithmic amplifier of claim 1, wherein the first tunable resonator is configured to be dynamically tuned by the control bus, wherein the dynamic tuning of the first tunable resonator is configured to adjust a frequency and bandwidth of a feedback signal applied to the input of the amplifying circuit at a first node.

13. The tunable logarithmic amplifier of claim 1, wherein the amplifying circuit and the first tunable resonator circuit are configured to be tuned based on information derived from baseband, wherein a channel quality indicator is used to optimize system performance.

14. The tunable logarithmic amplifier of claim 13, wherein the channel quality indicator comprises receive signal strength indicator (RSSI), signal to noise ratio (SNR), or a combination thereof.

15. A communication system, comprising:
an antenna coupled to an RF switch,
the RF switch further coupled to each of a transmit section and a receive section,
the transmit section comprising a transmitter sub-system coupled to a power amplifier and a first filter, and
the receive section comprising a receiver sub system, a tunable logarithmic amplifier, and a second filter,
wherein each of the transmit and receive sections is further coupled to a baseband processor;
said tunable logarithmic amplifier comprising:
an amplifying circuit having a first voltage input coupled to ground and a second voltage input coupled to a control bus via a first control line extending therebetween, wherein the control bus is configured to vary the second input voltage communicated through the first control line for configuring a response of the amplifying circuit; and
a first tunable resonator circuit comprising:
at least one voltage-controlled tunable component, the voltage-controlled tunable component being coupled to the control bus via a second control line extending therebetween,
wherein an output of the amplifying circuit is coupled to the first tunable resonator circuit, and
wherein an output of the first tunable resonator circuit is further coupled to an input of the amplifying circuit at a first node disposed therebetween;
the tunable logarithmic amplifier further characterized by:
a sampling circuit coupled to the amplifying circuit; and
a frequency to voltage converter coupled to each of the sampling circuit and an output port of the tunable logarithmic amplifier;
wherein the frequency to voltage converter is further coupled to the control bus via control lines extending therebetween.

16. A communication system, comprising:
an antenna coupled to an RF switch,
the RF switch further coupled to a power amplifier and a tunable logarithmic amplifier,
the tunable logarithmic amplifier further coupled to a demodulator,
wherein each of the RF switch, tunable logarithmic amplifier, and demodulator are further coupled to a baseband processor;
said tunable logarithmic amplifier comprising:
an amplifying circuit having a first voltage input coupled to ground and a second voltage input coupled to a control bus via a first control line extending therebetween, wherein the control bus is configured to vary the second input voltage communicated through the first control line for configuring a response of the amplifying circuit; and
a first tunable resonator circuit comprising:
at least one voltage-controlled tunable component, the voltage-controlled tunable component being coupled to the control bus via a second control line extending therebetween,
wherein an output of the amplifying circuit is coupled to the first tunable resonator circuit, and
wherein an output of the first tunable resonator circuit is further coupled to an input of the amplifying circuit at a first node disposed therebetween;
the tunable logarithmic amplifier further characterized by:
a sampling circuit coupled to the amplifying circuit; and
a frequency to voltage converter coupled to each of the sampling circuit and an output port of the tunable logarithmic amplifier;
wherein the frequency to voltage converter is further coupled to the control bus via control lines extending therebetween.

17. The communication system of claim 16, wherein the baseband processor is configured to survey signal metrics to determine a modulation coding scheme (MCS) that can be supported, and the communication system is further adapted to adjust bandwidth characteristics of the tunable logarithmic amplifier to support the MCS level.

18. The communication system of claim 17, wherein information from the demodulator is configured to assess signal quality using the baseband processor.

* * * * *